US009503254B2

United States Patent
Rahbar et al.

(10) Patent No.: US 9,503,254 B2
(45) Date of Patent: Nov. 22, 2016

(54) PHASE LOCKED LOOP WITH MODIFIED LOOP FILTER

(71) Applicant: MICROSEMI SEMICONDUCTOR ULC, Kanata (CA)

(72) Inventors: Kamran Rahbar, Kanata (CA); Peter Crosby, Ottawa (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 0 days.

(21) Appl. No.: 14/930,797

(22) Filed: Nov. 3, 2015

(65) Prior Publication Data

US 2016/0094334 A1 Mar. 31, 2016

Related U.S. Application Data

(62) Division of application No. 14/591,969, filed on Jan. 8, 2015, now Pat. No. 9,209,965.

(60) Provisional application No. 61/927,013, filed on Jan. 14, 2014.

(51) Int. Cl.

| | |
|---|---|
| H03D 3/24 | (2006.01) |
| H04L 7/033 | (2006.01) |
| H03L 7/00 | (2006.01) |
| H04J 3/06 | (2006.01) |
| H03L 7/093 | (2006.01) |

(52) U.S. Cl.
CPC ............... *H04L 7/0331* (2013.01); *H03L 7/00* (2013.01); *H03L 7/093* (2013.01); *H04J 3/0697* (2013.01)

(58) Field of Classification Search
CPC ............... H04L 7/033; H04L 27/2659; H03L 7/0893; H03L 7/0898; H03L 7/16
USPC ........ 375/376, 373, 375; 455/103, 127, 307; 341/143, 159; 327/156, 159
See application file for complete search history.

(56) References Cited

U.S. PATENT DOCUMENTS

| | | | |
|---|---|---|---|
| 7,999,586 B2* | 8/2011 | Lee | H03L 7/085 327/149 |
| 2008/0081584 A1* | 4/2008 | Taipale | H04L 27/08 455/219 |
| 2011/0200051 A1 | 8/2011 | Rivaud | |
| 2013/0307588 A1* | 11/2013 | Ferriss | H03L 7/16 327/105 |
| 2014/0049331 A1* | 2/2014 | Anandakumar | G01S 19/235 331/176 |
| 2015/0110162 A1 | 4/2015 | Van Den Bosch | |
| 2015/0110228 A1* | 4/2015 | Elenes | H04L 27/2657 375/343 |
| 2015/0214966 A1* | 7/2015 | Tong | H03L 7/0898 327/157 |

\* cited by examiner

*Primary Examiner* — Khai Tran
(74) *Attorney, Agent, or Firm* — Marks & Clerk; Richard J. Mitchell

(57) ABSTRACT

A loop filter in a modified phase locked loop has a proportional path generating first output signal that is proportional to an input signal and an integral path for generating a second output signal that is an integral of the input signal. An additional functional path generates a third output signal that is a predetermined function of the input signal. The predetermined function is of the form f(s)/g(s), where f and g are polynomial functions. An adder combines the first, second, and third output signals into a common output signal.

2 Claims, 3 Drawing Sheets

PHASE LOCKED LOOP WITH MODIFIED LOOP FILTER

CROSS REFERENCE TO RELATED APPLICATION

This application is a divisional application under 35 USC 121 of co-pending application Ser. No. 14/591,969, filed Jan. 8, 2015. This application also claims the benefit under 35 USC 119 (e) of U.S. provisional application No. 61/927,013, the contents of which are herein incorporated by reference.

FIELD OF THE INVENTION

This invention relates to the field of clock synchronization, and in particular to a phase locked loop with a modified loop filter. The invention further relates to a method of compensating for gain peaking when a phase locked loop (PLL) is located inside the feedback loop of another PLL.

BACKGROUND OF THE INVENTION

The use of PLLs in communications over the years has become an ever-growing trend. New applications with specific synchronization requirements demand complex and flexible PLLs. Economic and integration reasons are pushing for support for multiple application scenarios, each requiring different standards employing different synchronization clock criteria. User configurable flexibility has become essential part of the design of new PLLs.

In a hierarchical timing network, it is desirable to place inexpensive equipment on line cards at the edge of the network. Wander and jitter filtering is then performed further up the timing chain by fewer timing cards with higher quality oscillators. This approach works well when the system is configured in a cascaded fashion, as shown in FIG. 1, with the output of one PLL feeding the input of the next. As long as the bandwidth of the line card $PLL_1$ is much higher than the timing card $PLL_2$, the overall system transfer function will be defined by the timing card $PLL_2$ transfer function.

A typical prior art arrangement is shown in FIG. 2. It comprises a separate timing card 10 and line card 12 for use with a timing-over-packet (TOP) system. The line card 12 comprises $PLL_1$ 14 and a time stamping physical interface (PHY) 16. The timing card 10 comprises $PLL_2$ 18, which includes a numerically controlled oscillator (NCO). $PLL_1$ refers to the PLL the input clock recovered by the clock recovery module 20 and $PLL_2$ generates the final output clock and feedback signals for both PLLs. Clock recovery module 20, is placed on the timing card 10 and runs a suitable recovery algorithm such as the IEEE 1588 protocol. This arrangement requires a complex data interface between the two cards 10, 12 to transfer time stamps and other connection data.

There are various types of PLLs, broadly segregated into Type I PLLs and Type II PLLs. A typical PLL system contains an integrator and a proportional path in its loop filter. The type of the PLL can be defined based on number of integrator in its loop filter. For example a type I PLL does not contain an integrator in its loop filter transfer function, whereas a type II PLL does contain an integrator in its loop filter transfer function and is therefore of second order.

SUMMARY OF THE INVENTION

According to the present invention there is provided a modified phase locked loop including a loop filter comprising: a proportional path generating a first output signal that is proportional to an input signal; an integral path for generating a second output signal that is an integral of the input signal; an additional functional path for generating a third output signal that is a predetermined function of the input signal, said predetermined function being of the form $f(s)/g(s)$, where f and g are polynomial functions; and an adder for combing said first, second, and third output signals into a common output signal.

The additional functional path implements the function $f(s)/g(s)$, where $f(s)$ and $g(s)$ are polynomial functions and compensates for the gain peaking that would otherwise arise as a result of the multiple-loop configuration. In the preferred embodiment, $f(s)=X3s$ and $g(s)=1$, wherein X3 is some constant coefficient. In this case the functional path is a differential path. The loop filter then comprises a proportional path, an integral path and a differential path, which respectively scale, integrate, and differentiate the input signals.

According to another aspect of the invention there is provided a method of modifying a phase locked loop including a loop filter with a proportional path generating first output signal that is proportional to an input signal of the loop filter and an integral path for generating a second output signal that is an integral of the input signal, said method comprising adding an additional functional path to generate a third output signal that is a predetermined function of the input signal, said predetermined function being of the form $f(s)/g(s)$, where f and g are polynomial functions, and combining said first, second, and third output signals into a common output signal of the loop filter.

BRIEF DESCRIPTION OF THE DRAWINGS

The invention will now be described in more detail, by way of example only, with reference to the accompanying drawings, in which.

DETAILED DESCRIPTION OF EMBODIMENTS OF THE INVENTION

Embodiments of the invention implement a clock recovery algorithm on the line cards and use the output of the timing card filter to drive the time stamping physical interfaces (PHYs) on the line cards.

Figure 3:
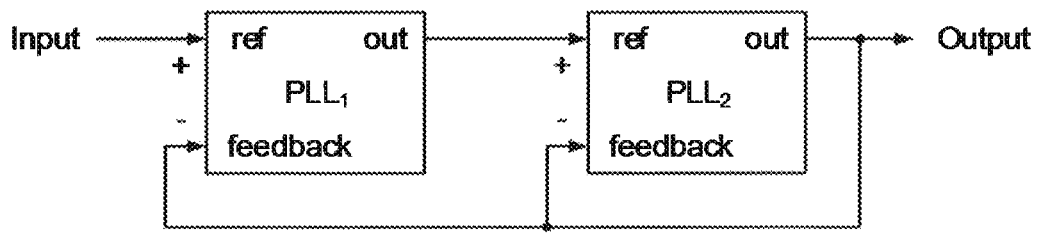
FIG. 3 is a high-level block diagram of a multi-loop PLL system.
Figure 4:
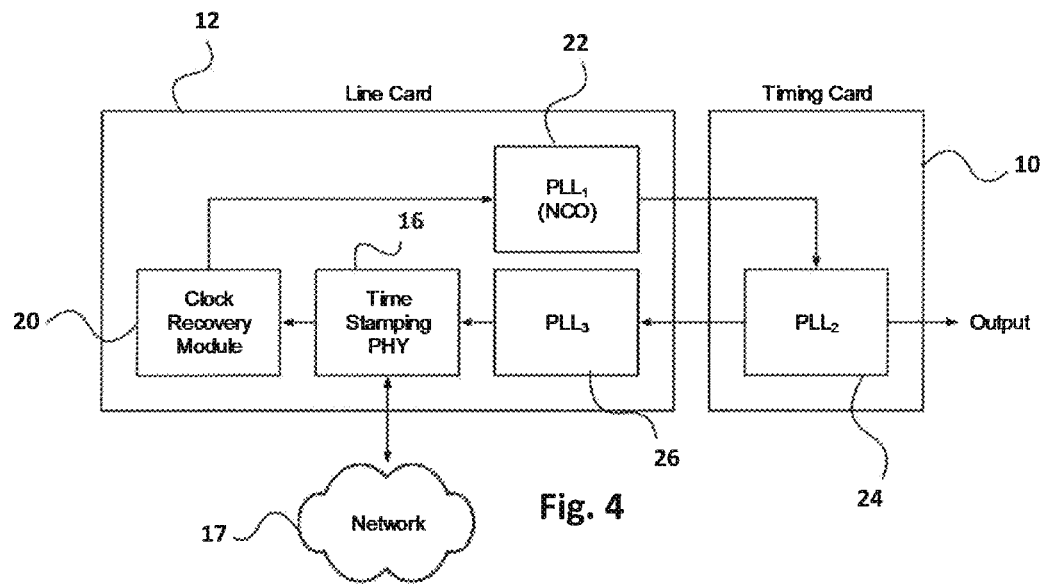
FIG. 4 is a block diagram of a ToP/system in accordance with an embodiment of the invention.

This arrangement simplifies the timing card design because no ToP data needs to be transferred up the timing chain from the line card to the timing card. The timing card only needs electrical clock signals as inputs and outputs. However, a side effect of this configuration is that the phase locked loop for the timing card PLL is actually inside the feedback loop of the ToP clock recovery module as shown in FIG. 4. This arrange me effect creates a multi-loop PLL system of the type shown in FIG. 3. Compared to a cascaded PLL system, this multi-loop PLL may change the system's transfer function such that undesirable gain peaking is introduced. Gain peaking, which is a term used in PLL system theory, refers to fact that the PLL gain transfer function, at certain frequency may exceeds 0 dB by some margin. Usually, PLLs are designed such that their gain peaking is below a certain dB, for example, 0.01 or 0.02 dB. In this case even if the timing and line card PLLs are designed to have gain peaking less than say 0.01 dB, in this multi-loop scenario their combined effect is not guaranteed to have same gain peaking and it can be much higher as shown, for example, in FIG. 5.

A diagram of a network interface comprising a novel ToP line card/timing card system is shown in FIG. 4. In this embodiment, the card clock recovery module 20 is placed on the line card 12, and $PLL_1$ 22, which includes an NCO, is embedded in a feedback loop including $PLL_2$ 24 on the timing card 10 and $PLL_3$ 26 on the line card 12. The $PLL_2$ 24 is a type II PLL with a known bandwidth and known damping factor. The line card 12 is located at the edge of the local network, and is the element that interfaces with the public, network 17, which may be the Internet. The line card 12 employs an inexpensive local oscillator driving the NCO in $PLL_1$ 22. The timing card 10 is located further downstream in the system and may be controlled by a more expensive crystal oscillator, such as a temperature controlled oscillator or an oven-controlled oscillator.

The first PLL 22 generates raw clock signals from the timing signals produced by the clock recovery module 20. These raw clock signals are then smoothed by the second $PLL_2$ 24 on the timing card and the smoothed clock signals are fed back to the time stamping PHY 16, which time stamps the incoming timing packets for the clock recovery module 20, optionally through an additional PLL, which will be described further below.

Figure 1:
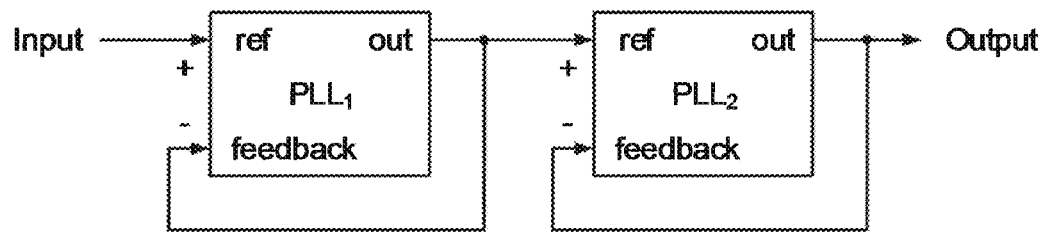
FIG. 1 is a high level block diagram of a prior art cascaded PLL system.
Figure 2:
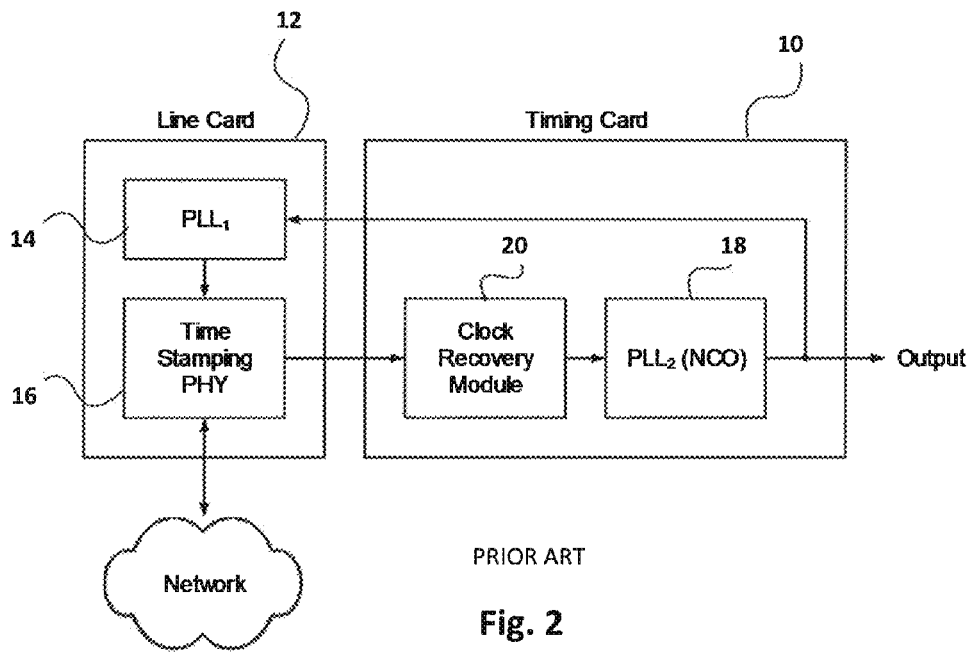
FIG. 2 is a block diagram of a prior art ToP card/timing system.

The configuration as illustrated in FIG. 4 greatly simplifies the interface between the timing card 10 and the line card 12 as compared to the prior art configuration of FIGS. 1 and 2, and is closer to PLL systems that receive electrical clock signals over synchronous networks or from stable oscillators and where $PLL_2$ on the timing card 10 is mainly used to clean up the output wander of the $PLL_1$ on the line card 12 rather than smooth the wander resulting from the clock recovery process.

The configurations shown in FIGS. 2 and 4 both constitute multi-loop PLL systems where one PLL is inside the feedback loop of the other PLL. In the first case shown in FIG. 2, the line card $PLL_1$ 14 is in the feedback loop of the lock recovery algorithm on the timing card while in the second case, shown in FIG. 4, the timing card $PLL_2$ 24 is in the feedback loop of the clock recovery algorithm.

Although the second system has three PLLs, the $PLL_3$ is set to a much higher bandwidth than $PLL_2$, so it does not affect the transfer function of the system; it only performs frequency conversion between the timing card 10 and the PHY16.

Since the line card $PLL_1$ in the prior art configuration of FIG. 2 has much higher bandwidth than the clock recovery algorithm on the timing card 10, even though the line card $PLL_1$ is in the feedback loop of the clock recovery algorithm, it does not affect its bandwidth and gain peaking is not a problem. However, the arrangement shown in FIG. 2, wherein the clock recovery is performed on the timing card requires a complex interface between the line card and the timing card.

In the second configuration of FIG. 4, the ToP clock recovery module 20 is placed on the line card 12. The bandwidth of clock recovery algorithm needs to be set to meet certain timing over packet performance requirements. For example for boundary clock operation, bandwidth of timing recovery algorithm is typically set to 100 mHz, which is same bandwidth used for timing card PLL. Since the bandwidth of the timing card $PLL_2$ can be comparable to that of the clock recovery module 20 algorithm, the overall transfer function can be affected by timing card $PLL_2$ 24 resulting in the possibility of gain peaking. In FIG. 2 the bandwidth of $PLL_1$ 14 is much higher than the PLL inherent within the clock recovery module 20. As an example the bandwidth of $PLL_1$ might be 14 Hz while the bandwidth of the clock recovery module PLL might be around 100 mHz. The bandwidth of the $PLL_2$ in a timing card PLL is also around 100 mHz. When the clock recovery module 20 is moved to the line card as shown in FIG. 4, then the bandwidth of the $PLL_1$ and $PLL_2$ on the line card and timing card be very close teach other. The bandwidth of the $PLL_1$, which is now on the line card, needs to be set to 100 mHz to meet timing over packet algorithm performance requirements; for example, they may each of a nominal bandwidth of around 100 mHz.

Figure 5:
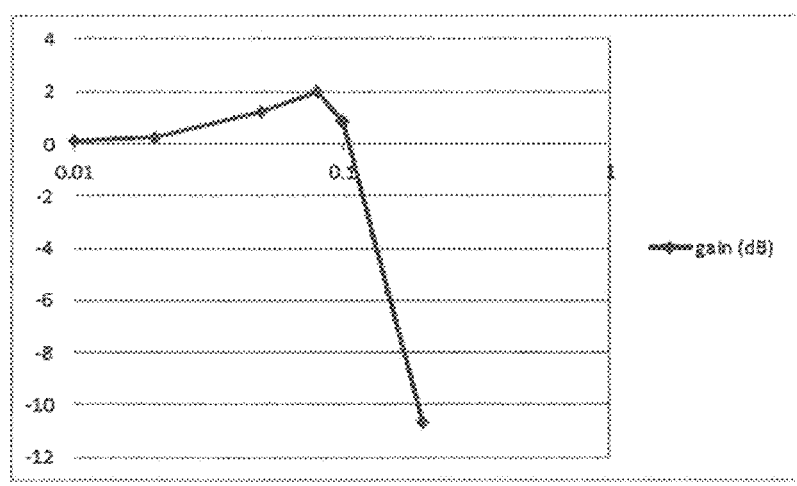
FIG. 5 shows the wander transfer function of a multi-loop PLL system without gain peaking compensation.

An example of the gain peaking that may happen in this case, is shown in FIG. 5. For most PLL applications, it is required that the overall system filters the input signal with the configured bandwidth settings and does not exhibit excessive gain peaking caused by the overall transfer function of the multi-loop arrangement.

Embodiments of the invention address the gain peaking arising from a Multi-loop PLL system by introducing a modification to a type II PLL, which includes a proportional path and an integrator, such that the overall transfer function of the system becomes similar to that of a single PLL system which inherently does not suffer from gain peaking.

The modified type II PLL system used for clock synchronization in accordance with embodiments of the invention compensates for the effect of the second PLL inside its feedback loop. In particular, a modified type II PLL has a loop filter including a proportional path and an integral path and an additional functional path in parallel with a proportional path and an integral path.

The additional functional path could be a differential path, although it could also be some other mathematical function to compensate for unwanted terms arising out of the multi-loop PLL such that the combination has a transfer function corresponding to a single type II PLL.

An advantage of this arrangement compared with the prior art is that the response of the system to input wander will behave in a manner very similar to that of a single PLL system, and undesired gain peaking can be eliminated. This allows simpler and more robust timing recovery systems to be implemented, especially for ToP applications.

Figure 6:
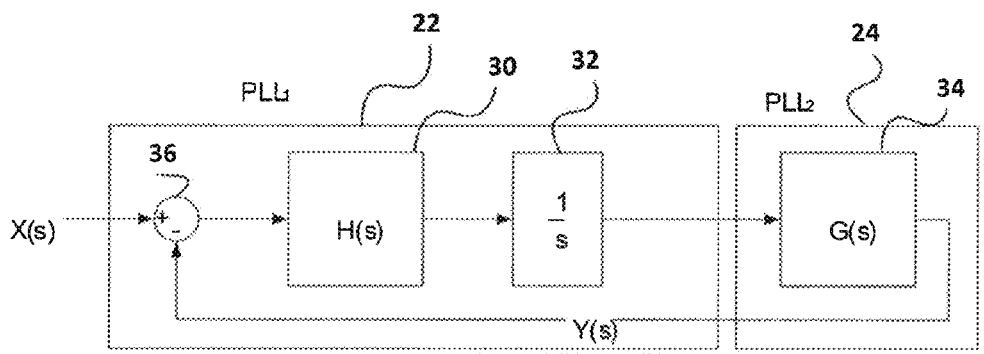
FIG. 6 is a block diagram showing the transfer functions of a PLL system in accordance with an embodiment of the invention.
Figure 7:
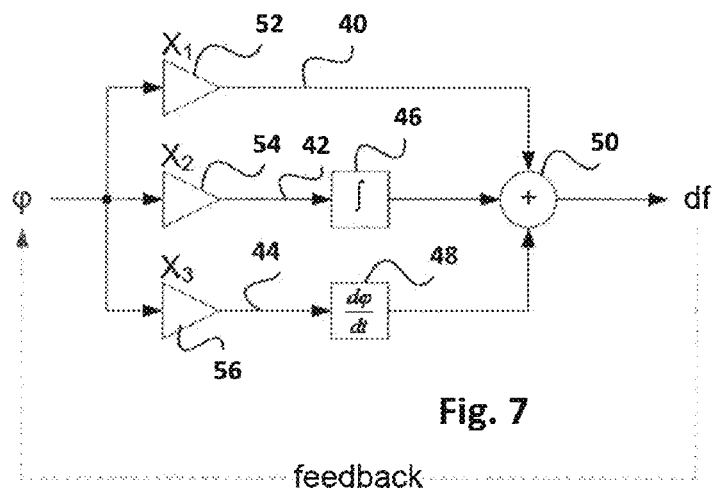
FIG. 7 shows a preferred embodiment of a PLL filter with a differentiator in accordance with an embodiment of the invention.

A block diagram showing the transfer functions of a multi-loop PLL is shown in FIG. 6. Block 30 is the loop filter circuit used in prior art digital phase locked loop (DPLL) of the type used to eliminate wander in systems receiving electrical clock signals as inputs from synchronous networks or stable clock sources as opposed to from clock recovery algorithms. This has a transfer function H(s). The loop filter circuit 30 converts phase offset values into frequency adjustment values for the NCO 32 with transfer function 1/s, where s is the Laplace variable, the combination of loop filter circuit 30 and NCO 32 forming part of $PLL_1$ 22. The preferred embodiment of this block is shown in FIG. 7.

Block 34 shows the transfer function CF(s) of $PLL_2$ 24.

In this multi-loop system the output Y(s) is subtracted from the input X(s) by subtractor 36.

The overall transfer function of the system T(s) is given by:

$$T(s) = \frac{\left(\frac{1}{s}\right)H(s)G(s)}{1+\left(\frac{1}{s}\right)H(s)G(s)} \quad (1)$$

As noted G(s) is the transfer function of $PLL_2$ 24 and is represented by:

$$G(s) = \frac{2\xi\omega_n s + \omega_n^2}{s^2 + 2\xi\omega_n s + \omega_n^2} \quad (2)$$

where $\xi$ is the damping factor, and $\omega n$ is the natural frequency of the PLL.

The output Y(s) of $PLL_2$ 34 is given by:

$$Y(s)=T(s)X(s) \quad (3)$$

A conventional type II PLL comprises a proportional part and an integral part, such that transfer function H(s) is represented by $$H(s) = X_1 + \frac{X_2}{s}$$

where $X_1$ is the proportional part and $$\frac{X_2}{s}$$

is the integral part.

It is generally not feasible to modify the transfer function of $PLL_2$ 24 since it resides on the timing card 10. Each timing card 10 serves multiple line cards 12, some of which recover their clocks using an asynchronous timing-over-packet recovery system, and some of which only accept electrical clocks obtained from a synchronous network or stable oscillator. The PLL on the timing card 10 can change its input clock from one line card to another. If the transfer function of the $PLL_2$ on the timing card 10 is modified, then it may not work with line cards dealing only with pure electrical signals. In certain embodiments, especially if a timing card 10 only serves line cards with recovered clocks, it may be possible as an alternative to change the transfer function of the $PLL_2$ on the timing card 10 to eliminate or at least reduce the unwanted gain peaking effect.

However, if an extra term $X_3 s$ is added to the transfer function of $PLL_1$ 22, as will be seen, the effects of the double loop can be cancelled out so that the system behaves as a single second order phase locked loop.

H(s) is then given by:

$$H(s) = X_1 + \frac{X_2}{s} + X_3 s \quad (4)$$

We can now find values for $X_1$, $X_2$, and $X_3$ such that the overall transfer function of the multi-loop PLL system will be similar to a second-order system. This can be represented as finding appropriate values for the coefficients $K_1$ and $K_2$ such that:

$$H(s)G(s) = K_1 + \frac{K_2}{s} \quad (5)$$

Substituting H(s) from (4) and G(s) from (2) into equation (5), gives:

$$(2\xi\omega_n s + \omega_n^2)\left(X_1 + \frac{X_2}{s} + X_3 s\right) = \left(K_1 + \frac{K_2}{s}\right)(s^2 + 2\xi\omega_n + \omega_n^2) \quad (6)$$

Solving the polynomial in (6) yields:

$$X_1 = K_1 \quad (7)$$
$$X_2 = K_2$$
$$X_3 = \frac{K_2}{\omega_n^2}$$

Note that the following constraint apply to $K_1$ and $K_2$:

$$\frac{K_1}{K_2} = \frac{2\xi}{\omega_n} \quad (8)$$

For example, if we decide to set $K_1$ and $K_2$ to:

$$K_1 = 2\xi\omega_n$$
$$K_2 = \omega_n^2 \quad (9)$$

then it will meet the constraint in (8) and we will have $$X_1 = 2\xi\omega_n$$
$$X_2 = \omega_n^2$$
$$X_3 = 1 \quad (10)$$

By designing H(s) as per (4) and setting the coefficients as per (9), the overall transfer function T(s) of the multi-loop PLL system can be made to have the same form as G(s). That is, the overall system has the same bandwidth and damping factor as a single PLL system.

In this embodiment the added term is a differential term $X_3 s$. However, it will be appreciated by one skilled in the art that more generally any function X(s) may be employed where X(s) is defined as f(s)/g(s) where f and g are polynomial functions of s.

In the special case illustrated in equation 10 where f(s) = X3s and g(s)= 1, the novel design for $PLL_1$ defined by (10) is effectively a loop filter similar to $PLL_2$ with an additional differentiator. The modification to the prior art type II PLL implementation is shown in FIG. 7.

in FIG. 7 paths 40, 42, and 44 represent the proportional, integral and differential paths respectively. The outputs of these paths are summed in adder 50, which produces feedback signal df. The path 42 includes integrator 46 and the path 44 includes differentiator 48. The gains are respectively set by amplifiers 52, 54, and 56.

Figure 8:
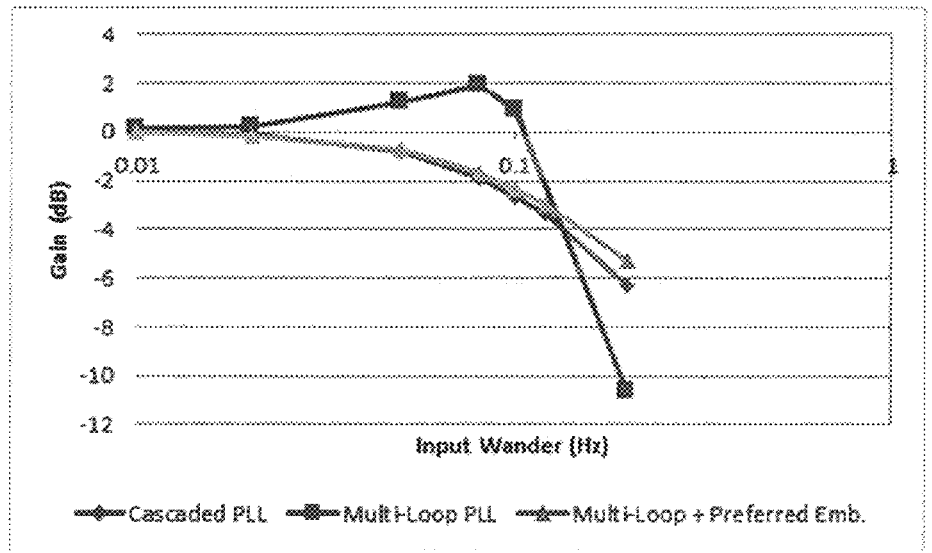
FIG. 8 shows the wander transfer function with gain peaking compensation in accordance with an embodiment of the invention.

The wander response before and after applying the preferred embodiment is shown in FIG. 8. As can be seen from this figure, the gain peaking caused by the multi loop PLL can be significantly improved using the proposed invention. As will be seen the multi-loop trace without the gain compensation of the invention has a distinct peak, as shown by the trace with square markers, whereas the multi-loop trace with gain compensation in accordance with embodiments of the invention, as shown by the trace with triangular markers, largely overlaps with the trace for a prior art cascaded PLL, as shown by the trace with diamond markers, and does not show significant gain peaking.

Embodiments of the invention thus provide a new timing recovery over packet system where the clock recovery algorithm is performed on the line card and its output is fed to a second PLL on the timing card. The output of the timing card PLL then drives the timestamp engine on the line card.

Moreover, a novel method is disclosed for compensating for the effect of a second PLL in the feedback loop of a multi-loop PLL such that combined transfer function of the two PLLs appear as nearly identical to a single type II PLL.

In a preferred embodiment of the proposed method for compensating for the effect of a second PLL, the second PLL consists of proportional part, an integral part and a differential part. The corresponding coefficients for these three parts are designed such that the overall combined system transfer function of the two PLLs is similar to a single type PLL.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks illustrated herein ay in practice be implemented in hardware or software running on a suitable processor.

The invention claimed is:

1. A modified phase locked loop including a loop filter comprising:
   a proportional path generating first output signal that is proportional to an input signal;
   an integral path for generating a second output signal that is an integral of the input signal;
   an additional functional path for generating a third output signal that is a predetermined function of the input signal, said predetermined function being of the form f(s)/g(s), where f and g are polynomial functions; and
   an adder configured to combine said first, second, and third output signals into a common output signal and wherein the loop filter has a transfer function H(s) of the form:

$$H(s) = X_1 + \frac{X_2}{s} + X_3 s$$

wherein $X_1 = 2\xi\omega_n$ $X_2 = \omega_n^2$ $X_3 = 1$ and where $\xi$ is the damping factor, and $\omega_n$ is the natural frequency of the phase locked loop.

2. A method of modifying a phase locked loop including a loop filter with a proportional path generating first output signal that is proportional to an input signal of the look filter and an integral path for generating a second output signal that is an integral of the input signal, said method comprising adding an additional functional path to generate a third output signal that is a predetermined function of the input signal, said predetermined function being of the form f(s)/g(s), where f and g are polynomial functions, and combining said first, second, and third output signals into a common output signal of the loop filter, and wherein the loop filter has a transfer function H(s) of the form:

$$H(s) = X_1 + \frac{X_2}{s} + X_3 s$$

wherein $X_1 = 2\xi\omega_n$ $X_2 = \omega_n^2$ $X_3 = 1$ and where $\xi$ is the damping factor, and $\omega_n$ is the natural frequency of the phase locked loop.

* * * * *